(12) United States Patent
Mercado

(10) Patent No.: US 8,493,670 B2
(45) Date of Patent: Jul. 23, 2013

(54) LARGE-FIELD UNIT-MAGNIFICATION CATADIOPTRIC PROJECTION SYSTEM

(75) Inventor: Romeo I. Mercado, Fremont, CA (US)

(73) Assignee: Coherent, Inc., Santa Clara, CA (US)

( * ) Notice: Subject to any disclaimer, the term of this patent is extended or adjusted under 35 U.S.C. 154(b) by 85 days.

(21) Appl. No.: 13/221,222

(22) Filed: Aug. 30, 2011

(65) Prior Publication Data

US 2012/0063010 A1    Mar. 15, 2012

Related U.S. Application Data

(60) Provisional application No. 61/381,718, filed on Sep. 10, 2010, provisional application No. 61/390,502, filed on Oct. 6, 2010.

(51) Int. Cl.
    *G02B 17/00*    (2006.01)
(52) U.S. Cl.
    USPC .......................................... 359/726; 359/727
(58) Field of Classification Search
    USPC ................................................ 359/726, 727
    See application file for complete search history.

(56) References Cited

U.S. PATENT DOCUMENTS

| | | | |
|---|---|---|---|
| 2,231,378 A | 2/1941 | Becker et al. |
| 3,536,380 A | 10/1970 | Ferguson |
| 3,748,015 A | 7/1973 | Offner |
| 4,103,989 A | 8/1978 | Rosin |
| 4,171,870 A | 10/1979 | Bruning et al. |
| 4,171,871 A | 10/1979 | Dill et al. |
| 4,293,186 A | 10/1981 | Offner |
| 4,302,079 A | 11/1981 | White |
| 4,391,494 A | 7/1983 | Hershel |
| 4,711,535 A | 12/1987 | Shafer |
| 4,796,984 A | 1/1989 | Wynne |
| 6,809,888 B1 | 10/2004 | Markle |
| 6,813,098 B2 | 11/2004 | Mercado |
| 6,831,731 B2 | 12/2004 | Omura et al. |
| 6,863,403 B2 | 3/2005 | Mercado et al. |
| 6,879,383 B2 | 4/2005 | Mercado |
| 7,116,496 B1 | 10/2006 | Mercado |
| 7,148,953 B2 | 12/2006 | Mercado |
| 7,158,215 B2 | 1/2007 | Harned et al. |
| 7,177,099 B2 | 2/2007 | Mercado et al. |
| 7,573,655 B2 | 8/2009 | Shafer |
| 7,643,128 B2 | 1/2010 | Harned et al. |
| 7,712,905 B2 | 5/2010 | Shafer et al. |
| 7,746,571 B2 | 6/2010 | Li et al. |
| 2006/0158615 A1 | 7/2006 | Williamson |

FOREIGN PATENT DOCUMENTS

EP    1959289 A1    8/2008

OTHER PUBLICATIONS

Bagdasarov et al., "Limiting Capabilities of Concentric Unit-Magnification Lens-Compensated Catadioptric Objectives", Soviet Journal of Optical Technology, vol. 50, No. 3, Mar. 1983, pp. 153-157.
Bouwer, A., "Achievements in Optics", Elsevier Publishing Company, Inc., 1946, p. 24,25 and 39.
Maksutov, D. D., "New Catadioptric Meniscus Systems", Journal of the Optical Society of America vol. 34, No. 5, May 1944, pp. 270-284.

(Continued)

*Primary Examiner* — William Choi

(74) *Attorney, Agent, or Firm* — Morrison & Foerster LLP

(57) ABSTRACT

A unit magnification projection optical system includes, listed in order along a system axis, a mirror, a lens group having negative power and a lens group having positive power. The optical system is a symmetric system, with an object plane on one side of the system axis and an object plane on an opposite side of the system axis. The object and image planes are spaced apart from the positive lens group by a working distance greater than 100 millimeters.

18 Claims, 24 Drawing Sheets

OTHER PUBLICATIONS

International Search Report and Written Opinion received for PCT Patent Application No. PCT/US2011/049866, mailed on Feb. 21, 2012, 11 pages.

International Search Report and Written Opinion received for PCT Patent Application No. PCT/US2012/033968, mailed on Jun. 8, 2012, 9 pages.

Dyson, J. "Unit Magnification Optical System without Seidel Aberrations", Journal of the Optical Society of America, vol. 49, No. 7, Jul. 1959, pp. 713-716.

Wynne, C. G., "A Unit-Power Telescope for Projection Copying", Optical Instruments and Techniques, J. H. Dickson, Ed., Oriel Press Ltd., Newcastle upon Tyne, England., 1969, pp. 429-434.

Wynne, C. G., "Monocentric telescope for microlithography", Optical Engineering, vol. 26, No. 4, Apr. 1987, pp. 300-303.

| | NA = 0.10 | | Image Field Diameter (mm) 290 | | Design Wavelength (nm) 980 | |
|---|---|---|---|---|---|---|
| SURFACE DESCRIPTION S# | RADIUS | SHAPE | T or S | MATERIAL | ELEMENT DESCRIPTION | |
| 0 | INF | FLT | 300.0000 | | Working distance WD | |
| 1 | INF | FLT | 44.7978 | NSF11(785257) | L1 | |
| 2 | -549.705 | CX | SPH | 1.0000 | | |
| 3 | 291.135 | CX | SPH | 51.2406 | NSF11(785257) | L2 |
| 4 | 783.461 | CC | SPH | 1.0000 | | |
| 5 | 269.415 | CX | SPH | 31.7186 | NSF11(785257) | L3 |
| 6 | 392.189 | CC | SPH | 1.0000 | | |
| 7 | 161.939 | CX | SPH | 12.0000 | NSF11(785257) | L4 |
| 8 | 133.939 | CC | SPH | 100.3965 | | |
| 9 | 278.786 | CX | SPH | 20.4421 | NSF11(785257) | L5 |
| 10 | 939.087 | CC | SPH | 1.0000 | | |
| 11 | 180.948 | CX | SPH | 12.0000 | NSF11(785257) | L6 |
| 12 | 121.905 | CC | SPH | 27.3804 | | |
| 13 | -290.200 | CC | SPH | 12.0000 | NSF11(785257) | L7 |
| 14 | -618.353 | CX | SPH | 34.0239 | | |
| 15 | -1272.884 | CC | SPH | | REFL(STOP) | Mirror M |

*FIG. 1A*

| | NA = 0.10 | | Image Field Diameter (mm) 290 | | Design Wavelength (nm) 980 | |
|---|---|---|---|---|---|---|
| S# | SURFACE DESCRIPTION RADIUS | SHAPE | T or S | MATERIAL | ELEMENT DESCRIPTION | |
| 0 | INF | FLT | 275.0000 | | Working distance WD | |
| 1 | INF | FLT | 38.7365 | NSF11(785257) | L1 | |
| 2 | -643.833 CX | SPH | 1.0000 | | | |
| 3 | 382.863 CX | SPH | 44.9965 | NSF11 (785257) | L2 | |
| 4 | 1447.015 CC | SPH | 12.2143 | | | |
| 5 | 448.889 CX | SPH | 25.2354 | NSF11 (785257) | L3 | |
| 6 | 738.462 CC | SPH | 39.9761 | | | |
| 7 | 442.531 CX | SPH | 15.2288 | NSF11 (785257) | L4 | |
| 8 | 481.662 CC | SPH | 95.9544 | | | |
| 9 | 313.748 CX | SPH | 19.1025 | NSF11 (785257) | L5 | |
| 10 | 967.023 CC | SPH | 1.0000 | | | |
| 11 | 167.172 CX | SPH | 12.0000 | NSF11 (785257) | L6 | |
| 12 | 118.670 CC | SPH | 27.3218 | | | |
| 13 | -425.181 CC | SPH | 12.0000 | NSF11 (785257) | L7 | |
| 14 | -1759.975 CX | SPH | 30.2337 | | | |
| 15 | -958.236 CC | SPH | | REFL (STOP) | Mirror M | |

*FIG. 2A*

| | | | | | |
|---|---|---|---|---|---|
| NA = 0.10 | | Image Field Diameter (mm) 300 | | Design Wavelength (nm) 980 | |

| SURFACE S# | DESCRIPTION RADIUS | SHAPE | T or S | MATERIAL | ELEMENT DESCRIPTION |
|---|---|---|---|---|---|
| 0 | INF | FLT | 300.0000 | | Working distance WD |
| 1 | 1975.477 CX | SPH | 40.2394 | NSF11 (785257) | L1 |
| 2 | -941.316 CX | SPH | 1.0000 | | |
| 3 | 555.498 CX | SPH | 33.9999 | NSF11 (785257) | L2 |
| 4 | 1778.137 CC | SPH | 1.0000 | | |
| 5 | 377.830 CX | SPH | 27.7699 | NSF11 (785257) | L3 |
| 6 | 560.946 CC | SPH | 114.6953 | | |
| 7 | 697.054 CX | SPH | 18.7777 | NSF11 (785257) | L4 |
| 8 | 1710.071 CC | SPH | 1.1694 | | |
| 9 | 459.775 CX | SPH | 20.0824 | NSF11 (785257) | L5 |
| 10 | 972.861 CC | SPH | 50.1544 | | |
| 11 | 177.092 CX | SPH | 12.0000 | NSF11 (785257) | L6 |
| 12 | 130.991 CC | SPH | 27.8807 | | |
| 13 | -462.996 CC | SPH | 12.0000 | NSF11 (785257) | L7 |
| 14 | -1310.226 CX | SPH | 39.2309 | | |
| 15 | -1032.490 CC | SPH | | REFL (STOP) | Mirror M |

*FIG. 3A*

| | | | | |
|---|---|---|---|---|
| NA = 0.10 | | Image Field Diameter (mm) 220 | | Design Wavelength (nm) 980 |

| S# | SURFACE DESCRIPTION RADIUS | SHAPE | T or S | MATERIAL | ELEMENT DESCRIPTION |
|---|---|---|---|---|---|
| 0 | INF | FLT | 250.00 | | Working distance WD |
| 1 | 612.227 CX | SPH | 12.0000 | NSF11(785257) | L1 |
| 2 | 387.176 CC | SPH | 30.6777 | | |
| 3 | 1133.831 CX | SPH | 37.4171 | NSF11(785257) | L2 |
| 4 | -824.721 CX | SPH | 1.0000 | | |
| 5 | 346.420 CX | SPH | 53.9747 | NSF11(785257) | L3 |
| 6 | -3231.165 CX | SPH | 104.7170 | | |
| 7 | 754.901 CX | SPH | 22.8602 | NSF11(785257) | L4 |
| 8 | -2013.930 CX | SPH | 62.0873 | | |
| 9 | 132.489 CX | SPH | 12.0000 | NSF11(785257) | L5 |
| 10 | 105.433 CC | SPH | 28.1644 | | |
| 11 | -254.654 CC | SPH | 12.0000 | NSF11(785257) | L6 |
| 12 | -557.606 CX | SPH | 23.1017 | | |
| 13 | -1119.250 CC | SPH | | REFL (STOP) | Mirror M |

*FIG. 5A*

| | | | | |
|---|---|---|---|---|
| NA = 0.10 | | Image Field Diameter (mm) 220 | | Design Wavelength (nm) 980 |

| SURFACE S# | DESCRIPTION RADIUS | SHAPE | T or S | MATERIAL | ELEMENT DESCRIPTION |
|---|---|---|---|---|---|
| 0 | INF | FLT | 200.0000 | | Working distance WD |
| 1 | 492.678 CX | SPH | 12.0000 | NSF11(785257) | L1 |
| 2 | 324.973 CC | SPH | 64.9341 | | |
| 3 | 625.431 CX | SPH | 48.0442 | NSF11(785257) | L2 |
| 4 | -929.821 CX | SPH | 80.4150 | | |
| 5 | 470.214 CX | SPH | 44.5102 | NSF11(785257) | L3 |
| 6 | -2818.088 CX | SPH | 1.0000 | | |
| 7 | 288.174 CX | SPH | 44.5102 | NSF11(785257) | L4 |
| 8 | 1808.758 CC | SPH | 78.6941 | | |
| 9 | 111.827 CX | SPH | 26.2250 | NSF11(785257) | L5 |
| 10 | 74.275 CC | SPH | 26.7947 | | |
| 11 | -205.917 CC | SPH | 12.0000 | NSF11(785257) | L6 |
| 12 | -405.781 CX | SPH | 10.8724 | | |
| 13 | INF | FLT | | REFL (STOP) | Mirror M |

*FIG. 6A*

| | | | |
|---|---|---|---|
| NA = 0.10 | Image Field Diameter (mm) 280 | | Design Wavelength (nm) 980 |

| SURFACE S# | DESCRIPTION RADIUS | SHAPE | T or S | MATERIAL | ELEMENT DESCRIPTION |
|---|---|---|---|---|---|
| 0 | INF | FLT | 250.00 | | Working distance WD |
| 1 | INF | FLT | 47.7952 | FUSED SILICA | L1 |
| 2 | -444.034 CX | SPH | 1.0000 | | |
| 3 | 558.136 CX | SPH | 35.0000 | FUSED SILICA | L2 |
| 4 | INF | FLT | 1.0000 | | |
| 5 | 338.181 CX | SPH | 50.0000 | FUSED SILICA | L3 |
| 6 | 1121.251 CC | SPH | 175.9219 | | |
| 7 | 209.015 CX | SPH | 20.0000 | FUSED SILICA | L5 |
| 8 | 172.260 CC | SPH | 95.8182 | | |
| 9 | -2873.159 CC | SPH | 12.0000 | FUSED SILICA | L6 |
| 10 | 1955.547 CC | SPH | 11.4647 | | |
| 11 | -762.079 CC | SPH | | REFL (STOP) | Mirror M |

*FIG. 7A*

| | | | | | |
|---|---|---|---|---|---|
| NA = 0.10 | | | Image Field Diameter (mm) 120 | | Design Wavelengths (nm) 436, 420, 405 |
| SURFACE DESCRIPTION S# RADIUS | | SHAPE | T or S | MATERIAL | ELEMENT DESCRIPTION |
| 0 | INF | FLT | 204.8886 | | Working distance WD |
| 1 | INF | FLT | 36.4929 | K10(501564) | L1 |
| 2 | -434.367 CX | SPH | 1.0000 | | |
| 3 | 535.447 CX | SPH | 26.8294 | NSK16(620603) | L2 |
| 4 | 2416.729 CC | SPH | 247.8132 | | |
| 5 | 509.779 CX | SPH | 20.0000 | NLAF2(744449) | L5 |
| 6 | -4025.513 CX | SPH | 60.4769 | | |
| 7 | -3838.403 CC | SPH | 12.0000 | F2(620364) | L6 |
| 8 | 311.409 CC | SPH | 27.0503 | | |
| 9 | 496.415 CX | SPH | 12.0000 | LLF1(548458) | L7 |
| 10 | 889.460 CC | SPH | 51.4486 | | |
| 11 | -791.758 CC | SPH | | REFL(STOP) | Mirror M |

*FIG. 8A*

| | NA = 0.10 | | Image Field Size (mm) 130 x 40 | | | Design Wavelength (nm) 980 |
|---|---|---|---|---|---|---|
| SURFACE S# | DESCRIPTION RADIUS | | SHAPE | T or S | MATERIAL | ELEMENT DESCRIPTION |
| 0 | INF | | FLT | 328.9759 | | Working distance WD |
| 1 | INF | | FLT | 60.0000 | NBK7 (517642) | L1 |
| 2 | -297.143 | | A-1 | 411.8371 | | |
| 3 | -372.578 | CC | SPH | 30.0617 | NBK7 (517642) | L5 |
| 4 | -525.426 | CX | SPH | 169.1252 | | |
| 5 | -1145.760 | CC | SPH | | REFL (STOP) | Mirror M |

| Aspheric S# | CURV | K | A | B | C | D |
|---|---|---|---|---|---|---|
| S2 | -0.00336538 | -0.380817 | 0 | 0 | 0 | 0 |

*FIG. 9A*

| | NA = 0.10 | | Image Field Size (mm) 130 x 40 | | Design Wavelength (nm) 980 |
|---|---|---|---|---|---|

| S# | SURFACE DESCRIPTION RADIUS | SHAPE | T or S | MATERIAL | ELEMENT DESCRIPTION |
|---|---|---|---|---|---|
| 0 | INF | FLT | 312.8032 | | Working distance WD |
| 1 | INF | FLT | 60.0000 | SILICA | L1 |
| 2 | -263.721 | A-1 | 237.3789 | | |
| 3 | -384.698 CC | SPH | 44.4902 | SILICA | L5 |
| 4 | -596.064 CX | SPH | 202.4557 | | |
| 5 | -1121.843 CC | SPH | | REFL (STOP) | Mirror M |

ASPHERIC CONSTANTS

| S# | CURV | K | A | B | C | D |
|---|---|---|---|---|---|---|
| S2 | -0.00379188 | -0.398681 | 0 | 0 | 0 | 0 |

*FIG. 9B*

| | | | |
|---|---|---|---|
| NA = 0.10 | Image Field Size (mm) 130 x 40 | | Design Wavelength (nm) 980 |

| SURFACE S# | DESCRIPTION RADIUS | SHAPE | T or S | MATERIAL | ELEMENT DESCRIPTION |
|---|---|---|---|---|---|
| 0 | INF | FLT | 173.5233 | | Working distance WD |
| 1 | INF | FLT | 150.0000 | NBK7 (517642) | Prism PR1/Prism PR2 glass path |
| 2 | INF | FLT | 0.0000 | | |
| 3 | INF | FLT | 60.0000 | NBK7 (517642) | L1 |
| 4 | -297.143 | A-1 | 478.2993 | | |
| 5 | -358.888 CC | SPH | 30.0617 | NBK7 (517642) | L5 |
| 6 | -461.620 CX | SPH | 108.1157 | | |
| 7 | -1029.965 CC | SPH | | REFL (STOP) | Mirror M |

| Aspheric S# | CURV | K | A | B | C | D |
|---|---|---|---|---|---|---|
| S4 | -0.00336538 | -0.202214 | 0 | 0 | 0 | 0 |

*FIG. 10A*

| | NA = 0.10 | | Image Field Size (mm) 130 x 40 | | | Design Wavelength (nm) 980 | |
|---|---|---|---|---|---|---|---|

| SURFACE DESCRIPTION | | | | | ELEMENT | |
|---|---|---|---|---|---|---|
| S# | RADIUS | | SHAPE | T or S | MATERIAL | DESCRIPTION |
| 0 | INF | | FLT | 235.6697 | | Working distance WD |
| 1 | INF | | FLT | 100.0000 | SILICA | Prism PR1/Prism PR2 glass path |
| 2 | INF | | FLT | 0.0000 | | |
| 3 | INF | | FLT | 55.0000 | SILICA | L1 |
| 4 | -263.277 | | A-1 | 293.7692 | | |
| 5 | -384.561 | CC | SPH | 25.0000 | SILICA | L5 |
| 6 | -587.330 | CX | SPH | 290.5611 | | |
| 7 | -1106.830 | CC | SPH | | REFL (STOP) | Mirror M |

| ASPHERIC S# | CURV | K | A | B | C | D |
|---|---|---|---|---|---|---|
| S4 | -0.00379828 | -0.364417 | 0 | 0 | 0 | 0 |

*FIG. 10B*

LARGE-FIELD UNIT-MAGNIFICATION CATADIOPTRIC PROJECTION SYSTEM

PRIORITY CLAIM

This application claims priority of U.S. Provisional Application No. 61/381,718, filed Sep. 10, 2010 and U.S. Provisional Application No. 61/390,502 filed Oct. 6, 2010, both assigned to the assignee of the present invention and the complete disclosure of which is hereby incorporated herein by reference.

TECHNICAL FIELD OF THE INVENTION

The present invention relates in general to projection optical systems. The invention relates in particular to large-field, unit-magnification projection optical systems for photolithography and masked laser-patterning applications.

DISCUSSION OF BACKGROUND ART

Photolithography is presently employed in sub-micron resolution integrated circuit (IC) manufacturing, and, to an increasing degree, in advanced, wafer-level IC packaging technologies, and in micro-mechanical systems (MEMS), nano-technology, among other applications. These applications require multiple imaging capabilities ranging from relatively low resolution, for example a few micrometers (μm), with large depth of focus, to relatively high resolution, for example sub-μm, and with high throughput. A commonly used projection optical system for these applications is a unit-magnification projections lens.

A unit-magnification, imaging, catadioptric, single-reflection optical system, consisting of a spherical mirror and a plano-convex lens, is described in a paper by J. Dyson, entitled "*Unit magnification optical system without Seidel aberrations,*" *J. Opt. Soc. Am.* 49(7), pp. 713-716 (1959). In this single-reflection optical system, there is an aperture stop at the mirror, and the axial thickness of the plano-convex lens is equal to the radius of curvature of its convex surface. The lens is spaced apart from the mirror such that the centers of curvature of the spherical surfaces of the mirror and the lens are concentric and lie on the optical axis of the object and image planes. The radius of curvature of the mirror and the convex surface of the lens are chosen such that the Petzval sum of the optical system is zero. Such a concentric system is paraxially telescopic or telecentric in the object and image spaces. The object and image fields of this unit-magnification Dyson system are mutually inverted and lie on the rear plane surface of the lens. This system is well corrected for Seidel aberrations, i.e., no third-order monochromatic aberrations, but the lens contributes substantial higher-order aberration for off-axis field points, in addition to chromatic aberrations when used over an extended spectral range. The Dyson system has been used to image one half of the full image plane surface onto the other half. It has been used as projection optical system for photolithography for small field, narrow spectral-band exposure systems.

A modified Dyson system is described by C. G. Wynne in articles "*A unit power telescope for projection copying,*" *Optical Instruments and Techniques, Oriel Press, Newcastle upon Tyne, England* (1969), and "*Monocentric telescope for microlithography,*" *Opt. Eng.* 26(4) 300-303 (1987). Wynne modified the Dyson system and extended its optical performance by using a doublet lens consisting of a monocentric negative meniscus element cemented to a plano-convex lens element. This unit-magnification Wynne-Dyson optical system provides very high aberration correction over an extended field of view at numerical aperture greater than 0.30, and over quite a wide spectral range. Correction from 546 nm to 405 nm is possible for a system designed to work in the visible spectrum, where a wide range of optical glasses is available.

Like the Dyson system, the plane surface of the doublet lens of the Wynne-Dyson system is imaged, inverted, on itself. In practice, the object is generally placed in one half of the object/image plane with the image appearing on the other half. Wynne described two practical methods of separating and transferring these object and image planes to more convenient positions. The first method is to convert part of the thick glass lens block into two identical folding prisms. This provides good access to both the object and image planes but the cost of this gain is the substantial reduction of available object/image field size. This method of field division was used on Wynne-Dyson type optical systems described in several patents including U.S. Pat. Nos. 4,391,494, 4,171,871, 4,103,989, 6,813,098, 6,879,383, 7,116,496, and 7,148,953. A second method, which provides a larger imaging field area but with considerable loss of light, inserts in the rear glass block a semi-reflecting surface at 45° to the optical axis, forming a beam-splitter. The use of the beam-splitter enables the separation of the object and image planes without sacrificing the field size. The beam-splitter method of separating the object and image surfaces is used in Dyson systems described in several patents, including U.S. Pat. Nos. 4,171,870, 4,302,079, 3,536,380, and 2,231,378.

The unit-magnification optical systems described in the above-referenced patents have working distances (air spaces between an outermost optical element and object or image planes) ranging from a fraction of a millimeter (mm) to a few millimeters. These systems are suited for photolithography applications in the ultraviolet and deep ultraviolet regions of the electromagnetic spectrum. While the projection lens designs described in these above referenced patents are quite suitable for normal photolithography aspects at wavelengths of 404 nanometers (nm), 365 nm and 248 nm and a 0.35 NA exposure system, such lens designs have not provided capabilities at large working distances and diode-laser wavelengths, for example, 808 nm, 980 nm, and 1024 nm.

The design embodiments described in the above-referenced patents are not suitable for exposure systems requiring large rectangular exposure fields with lengths ranging from 100 mm to a few hundred mm, and with working distances of at least 100 mm. Such field dimensions and working distances are required for masked laser-patterning apparatus used in the manufacture of liquid crystal, LED, and OLED display panels or screens.

For theses applications, it is desirable to provide optical designs of large-field unit-magnification projection optical systems capable of imaging, in one exposure, large rectangular object fields with lengths greater than 100 mm, and having working distances greater than 100 mm. This would significantly increase system throughput in masked laser-patterning apparatus.

SUMMARY OF THE INVENTION

In one aspect of the present invention a unit-magnification optical system having a longitudinal system axis, comprises a mirror located on the system axis. An aperture stop is located at the mirror and defines a numerical aperture (NA) of the system. A first lens group including at least one lens element and having negative optical power is located on the system axis and spaced apart from the mirror. A second lens group including at least one lens element having positive optical power is located on the system axis and spaced apart from the first lens group. An object plane is spaced apart by a first working distance from the second lens group side. An image plane spaced apart from the second lens group by a second working distance. The object plane and image plane lie on opposite sides of the system axis.

In preferred embodiments of the present invention described below the first and second working distances are equal and the image and object planes are coplanar. The mirror can be a plane mirror or a curved mirror. Embodiments are described in which the first and second lens groups each include only one lens element, and in which the first and second lens groups each include a plurality of lens elements. Embodiments are described in which plane mirrors or prisms are used to separate the image and object planes to conveniently accessible locations.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

FIG. 1A is a table presenting an exemplary optical prescription for the optical system of FIG. 1.

FIG. 2A is a table presenting an exemplary optical prescription for the optical system of FIG. 2.

FIG. 3A is a table presenting an exemplary optical prescription for the optical system of FIG. 2.

FIG. 5A is a table presenting an exemplary optical prescription for the optical system of FIG. 5.

FIG. 6A is a table presenting an exemplary optical prescription for the optical system of FIG. 6.

FIG. 7A is a table presenting an exemplary optical prescription for the optical system of FIG. 7.

FIG. 8A is a table presenting an exemplary optical prescription for the optical system of FIG. 8.

FIG. 9A is a table presenting one exemplary optical prescription for the optical system of FIG. 9.

FIG. 9B is a table presenting another exemplary optical prescription for the optical system of FIG. 9.

FIG. 10A is a table presenting one exemplary optical prescription for the optical system of FIG. 10.

FIG. 10B is a table presenting another exemplary optical prescription for the optical system of FIG. 10.

DETAILED DESCRIPTION OF THE INVENTION

Figure 1:
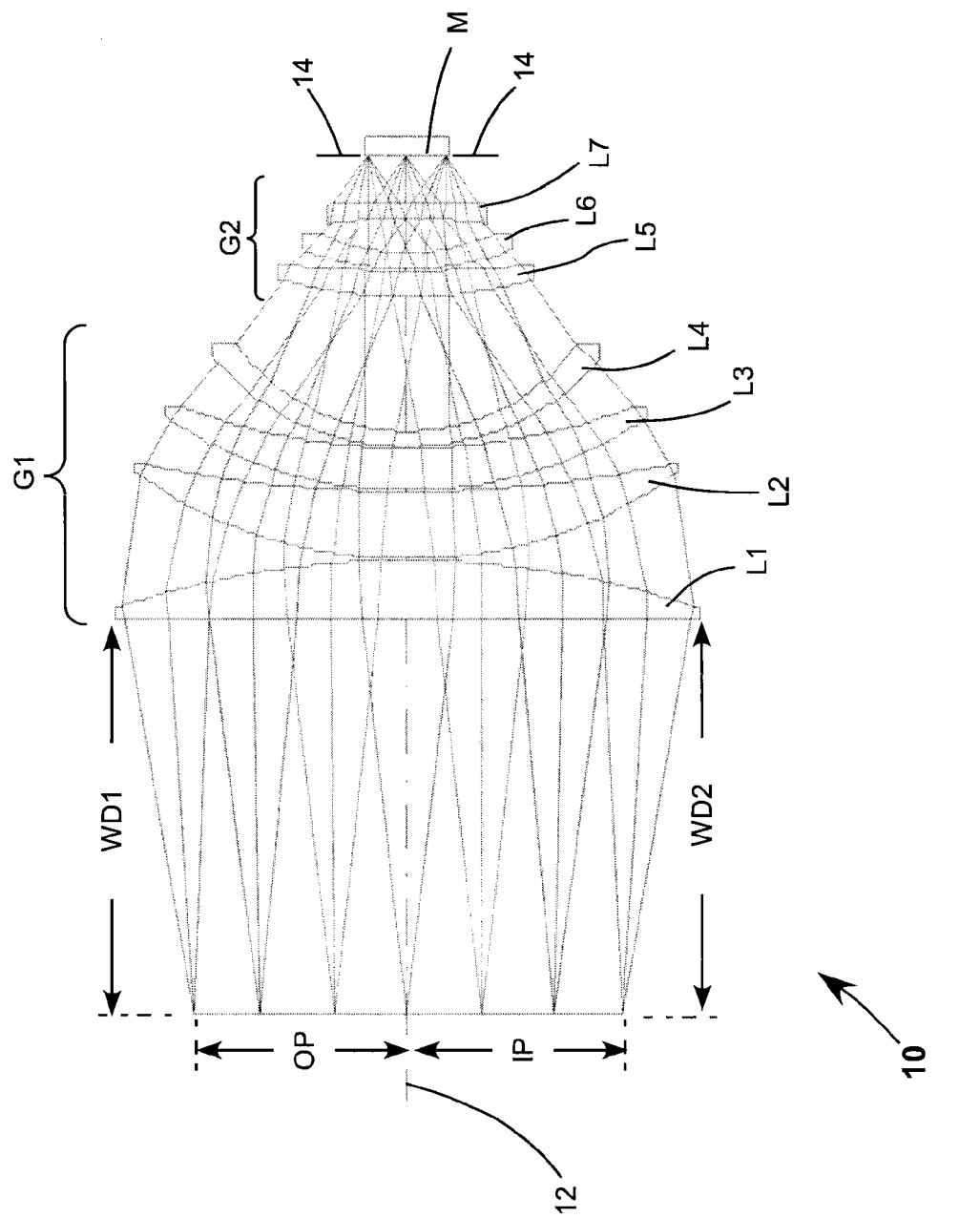
FIG. 1 is an unshaded cross-section view schematically illustrating a first preferred embodiment of a unit-magnification projection optical system in accordance with the present invention, including coplanar object and image planes, a four-element positive lens group, a three-element negative lens group, and a concave mirror, arranged in order along a longitudinal optical axis of the system.

Referring now to the drawings, wherein like components are designated by like reference numerals, FIG. 1 schematically illustrates a first preferred embodiment 10 of a unit-magnification projection optical system in accordance with the present invention. System 10 has a longitudinal optical axis 12. Arranged along axis 12 are an object plane OP, and an image plane IP, a lens group G1 having net negative optical power, a lens group G2 having net positive optical power, and a concave mirror M. An aperture stop 14, which can be a variable aperture stop, is located at mirror M. In the embodiment of FIG. 1 positive lens group G1, negative lens group G2, and mirror M are air-spaced apart from each other, while object plane OP and image plane IP are in the same plane, or coplanar.

In the embodiment of FIG. 1, lens group G1 includes air-spaced lens elements L1, L2, L3, and L4. L1 is a plano-convex element and L2 is a positive meniscus element. L3 is a positive meniscus element; and L4 is a negative meniscus element. Lens group G2 includes air-spaced lens elements L5, L6, and L7. L5 is a positive meniscus element; L6 is a negative meniscus element; and L7 is a negative meniscus element.

Object plane OP is spaced apart from the vertex of the first surface of the lens system, i.e., from first surface of element L1, by a working distance WD1. Image plane IP is spaced apart from the vertex of the last surface of the lens system from a double-pass perspective, i.e., from a surface coincident with the first surface of L1, by a working distance WD2. Projection optical system 10 of FIG. 1 is holosymmetric (reversibly symmetric) relative to aperture stop 14. Accordingly WD1=WD2. Since optical system 10 is holosymmetric, the system is initially corrected for third-order coma, distortion, and lateral color aberrations.

An exemplary optical prescription for the embodiment of FIG. 1 is presented in table form in FIG. 1A. This prescription is corrected for a wavelength of 980 nm±5 nm, i.e., between about 975 nm and 985 nm. This prescription is from CODE V optical design software available from SYNOPSIS INC. of Mountain View, Calif. Those skilled in the optical design art will be familiar with such prescription tables and will be able to match the listed surfaces with those depicted in FIG. 1. For completeness of description, however, a brief description of how to read such tables is set forth below, and is applicable to the table of FIG. 1A and similar tables presented herein.

In the prescription tables, a positive radius indicates the center of curvature to the right of the surface, and a negative radius indicates the center of curvature to the left (referred to the drawings). The thickness is the axial distance to the next surface and all dimensions are in millimeters. Further, "S#" stands for surface number, "T or S" stands for "thickness or separation," and "STOP" stands for aperture stop 14. Also, "CC" stands for "concave" and "CX" stands for "convex." Further, under the heading "surface shape," an aspheric surface is denoted by "ASP", a flat surface by "FLT", and a spherical surface by "SPH."

Further under the heading of "material", both the glass name and the six-digit number using the internationally known and accepted convention for optical material designation are listed. For example, 517642 denotes NBK7 glass and this designation implies that NBK7 has a refractive index, $N_d$, of about 1.517 at the helium d-line wavelength, and an Abbe number of about 64.2 relative to the d-line and the C and F-lines of hydrogen. The Abbe number, $V_d$, is defined by the equation:

$$V_d = (N_d - 1)/(N_F - N_C)$$

where $N_F$ and $N_C$ are the refractive index values of the glass at the F and C lines. An aspheric equation describing an aspherical surface is given by:

$$Z = \frac{(CURV)Y^2}{1 + (1 - (1 - (1+K)(CURV)^2 Y^2)^{\frac{1}{2}}} + (A)Y^4 + (B)Y^6 + (C)Y^8 + (D)Y^{10} + (E)Y^{12}$$

wherein "CURV" is the spherical curvature of the surface (the reciprocal of the radius of curvature of the surface), K is the conic constant, and A, B, C, D, and E are the aspheric coefficients. In the Table, "e" denotes the exponential notation (powers of 10). The design wavelengths represent wavelengths in the spectral band of the projection optical system, i.e., the wavelengths for which a particular system is corrected.

Figure 2:
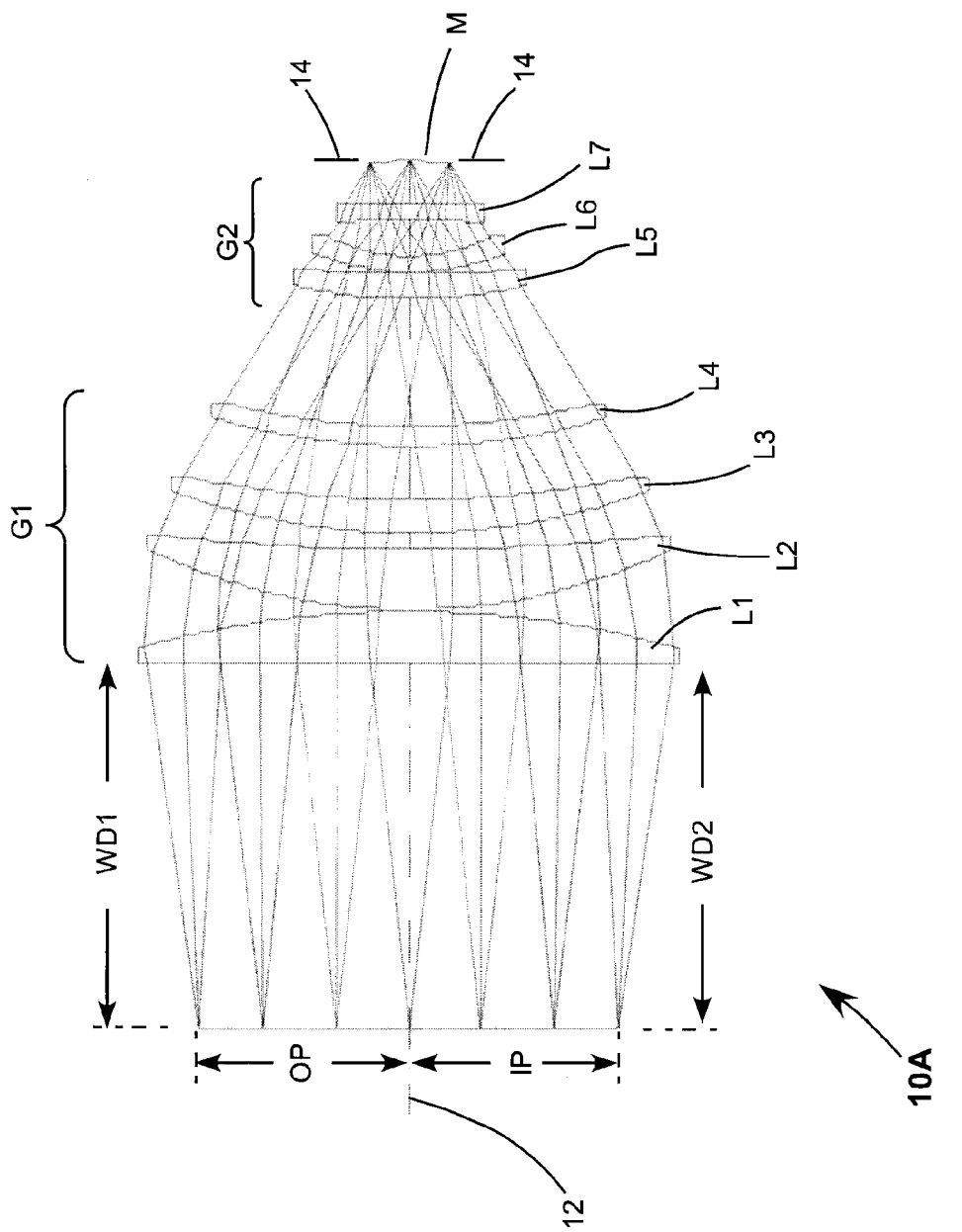
FIG. 2 is an unshaded cross-section view schematically illustrating a second preferred embodiment of a unit-magnification projection optical system in accordance with the present invention, similar to the embodiment of FIG. 1 but wherein individual element prescriptions of the positive and negative lens groups are different.

FIG. 2 schematically illustrates a second preferred embodiment 10A of a unit-magnification projection optical system in accordance with the present invention. Embodiment 10A is similar to embodiment 10 of FIG. 1 with an exception that element L4 of element group G1 is a positive meniscus element in embodiment 10A. Other elements are as described above. However, the prescriptions have changed. An exemplary optical prescription for embodiment 10A of FIG. 2 is presented in tabular form in FIG. 2A.

Figure 3:
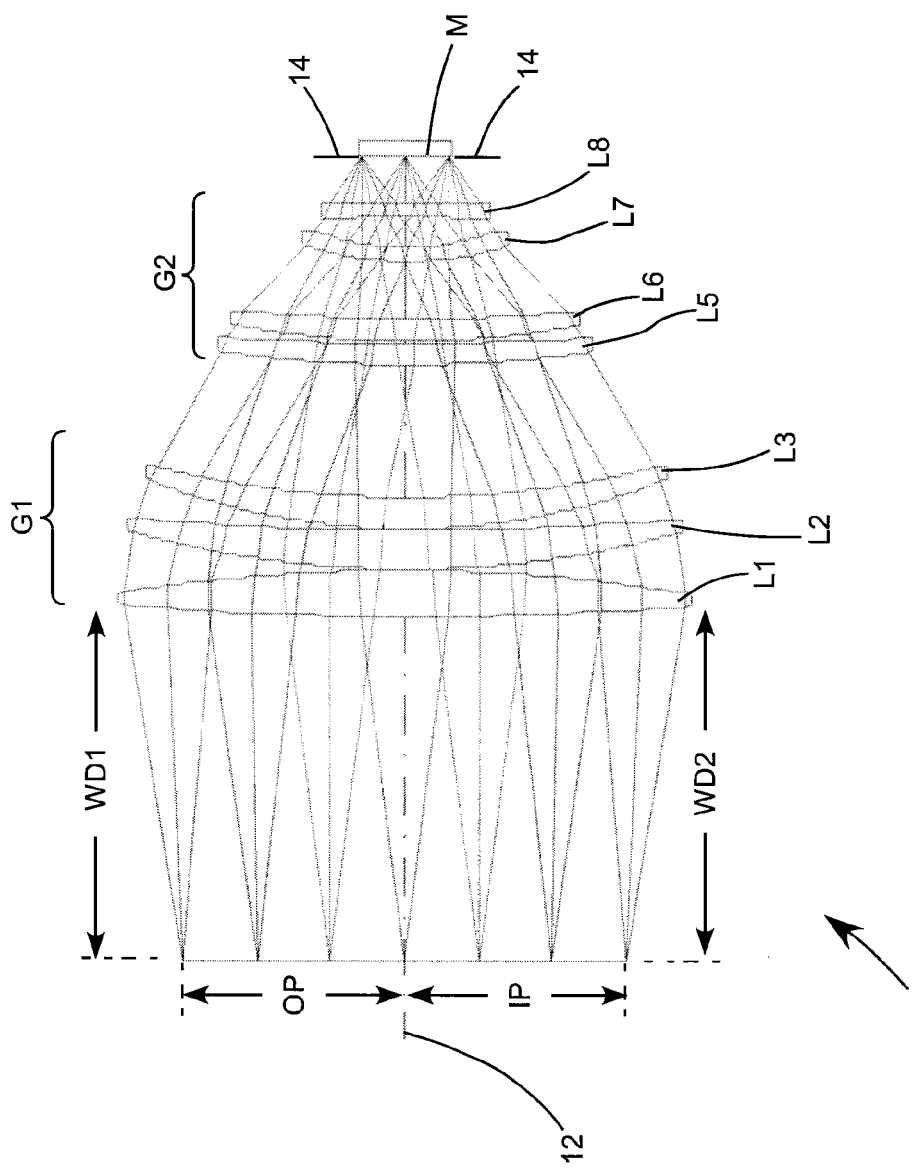
FIG. 3 is an unshaded cross-section view schematically illustrating a third preferred embodiment of a unit-magnification projection optical system in accordance with the present invention, including coplanar object and image planes, a three-element positive lens group, a four-element negative lens group, and a concave mirror, arranged in order along a longitudinal optical axis of the system.

FIG. 3 schematically illustrates a third preferred embodiment 10B of a unit-magnification projection optical system in accordance with the present invention. System 10 has a longitudinal optical axis 12. Embodiment 10B is similar to embodiment 10 of FIG. 1 with an exception that positive lens group G1 includes only three elements, while negative lens group G2 now includes four elements.

In the embodiment of FIG. 3, lens group G1 includes air-spaced lens elements L1, L2, L3. L1 is a bi-convex element, and L2 and L3 are positive meniscus elements. Lens group G2 includes air-spaced lens elements L5, L6, L7, and L8. L5 and L6 are positive meniscus elements, and L7 and L8 are negative meniscus elements. An exemplary optical prescription for the optical system of FIG. 3 is presented in tabular form in FIG. 3A.

The optical prescriptions the tables of FIGS. 1A, 2A, and 3A provide diffraction-limited image quality performance at numerical aperture of 0.1 over the spectrum of 980 nm±5 nm covering system image-field diameters of 290-300 mm listed in the tables. The practical application of these unit-magnification projection optical systems in lithography or masked laser patterning apparatus is to image one half of the full image plane surface onto the other half. For such field division, each of the embodiments with prescriptions FIGS. 1A, 2A, and 3A should enable a narrow rectangular exposure field size of at least 260 mm×2 mm, for the NA≦0.10 configuration, with the large working distances (greater than about 100 mm) shown in the tables. Further, any square or rectangular field size that may be inscribed in the area-bounded semi-circular field-size area can be used to suit the desired application.

Figure 4:
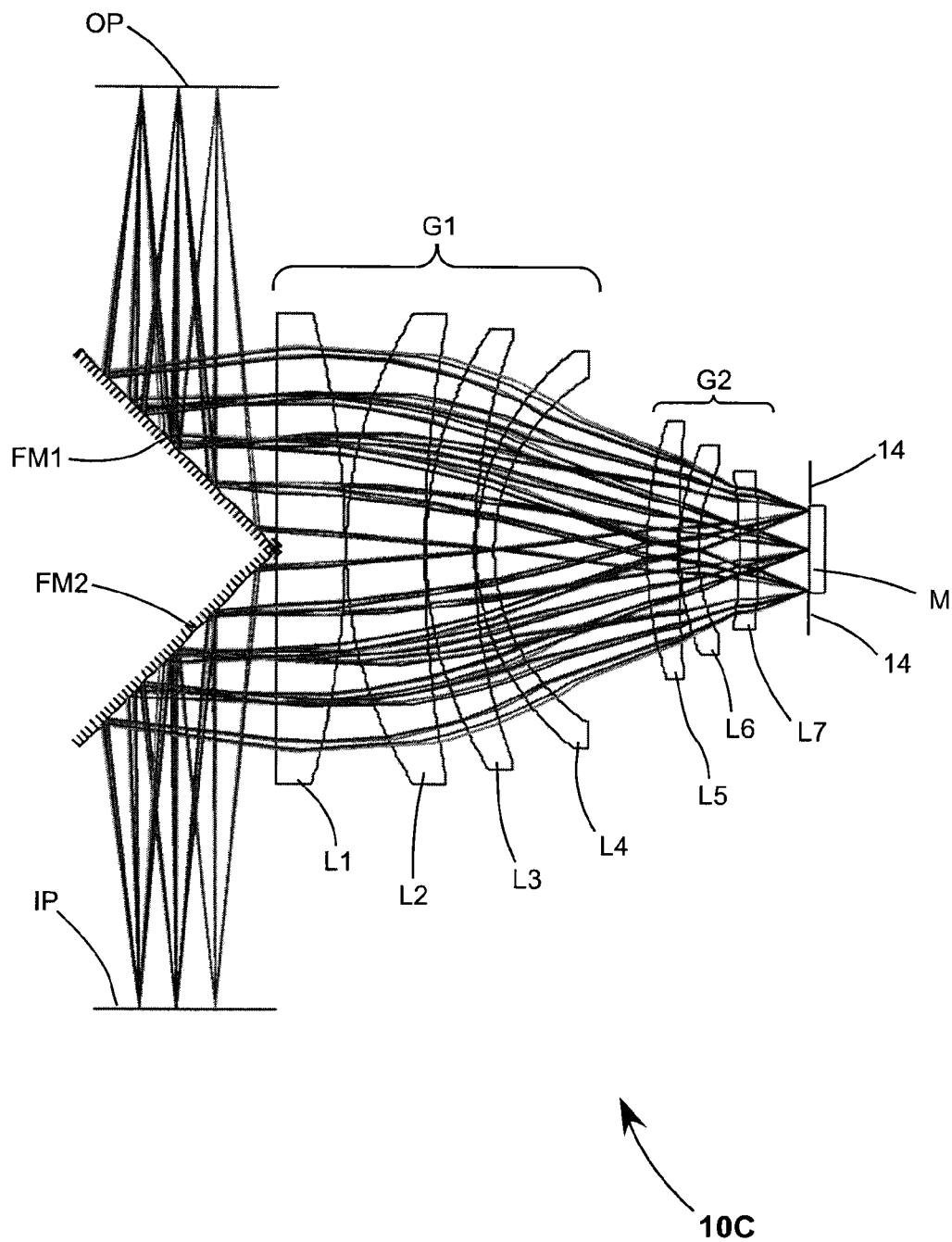
FIG. 4 is an unshaded cross-section view schematically illustrating a fourth preferred embodiment of a unit-magnification projection optical system in accordance with the present invention, similar to the embodiment of FIG. 1, but further including two plane fold-mirrors arranged to separate the image and object planes such that the planes are separate and remote from each other.

FIG. 4 schematically illustrates a fourth preferred embodiment of a unit magnification optical projection system in accordance with the present invention. This embodiment is similar to the embodiment of FIG. 1 but further includes a pair of identical fold mirrors FM1 and FM2 used to separate and to transfer the object plane OP and image plane IP to conveniently accessible positions separate and remote from each other. In one computed example, a field diameter of 290 mm was achieved in which would fit a 230 mm×50 mm rectangular image field size for a NA=0.1 configuration.

Figure 5:
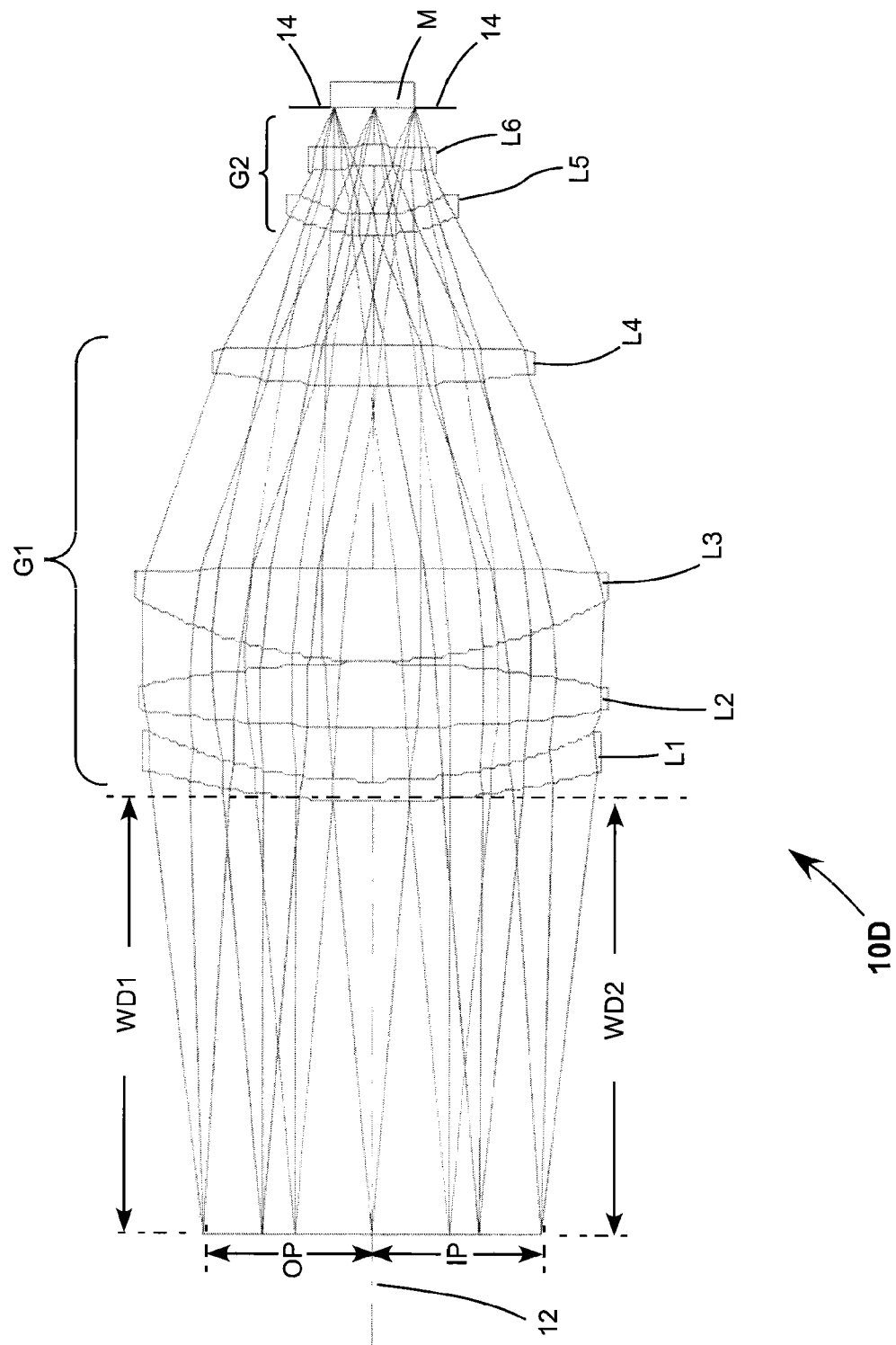
FIG. 5 is an unshaded cross-section view schematically illustrating a fifth preferred embodiment of a unit-magnification projection optical system in accordance with the present invention, similar to the embodiment of FIG. 1, but wherein the negative lens group includes only two lens elements.

All of the above-described embodiments of the present invention include a concave mirror and a total of seven refractive elements. FIG. 5 schematically illustrates a fifth preferred embodiment 10D of a unit magnification optical projection system in accordance with the present invention in which there is a concave mirror and only six refractive elements in total. The elements are arranged in positive-power and negative-power groups, G1 and G2 respectively, in the manner of embodiments 10, and 10A-C.

In the embodiment of FIG. 5, group G1 includes elements L1, L2, L3, and L4. Group G2 includes elements L5 and L6. Element L1 is a negative meniscus element; L2 is a bi-convex element; L3 is a bi-convex element; and L4 is a bi-convex element. Elements L5 and L6 are both negative meniscus elements. An exemplary optical prescription for the embodiment of FIG. 5 is present in table form in FIG. 5A. This example has a 220 mm field diameter, and NA=0.10 with diffraction-limited image quality performance at the narrow band centered at 980 nm.

Figure 6:
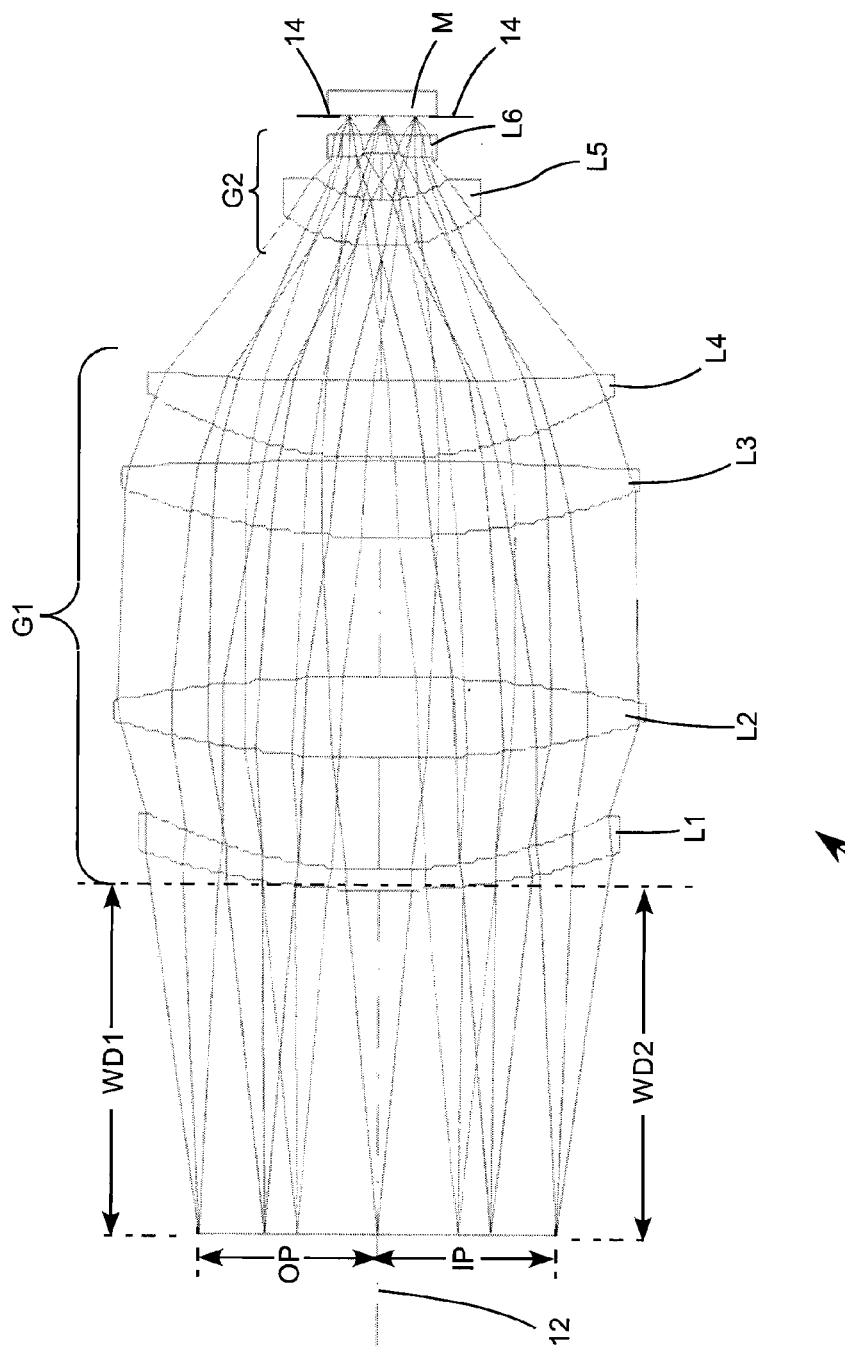
FIG. 6 is an unshaded cross-section view schematically illustrating a sixth preferred embodiment of a unit-magnification projection optical system in accordance with the present invention, similar to the embodiment of FIG. 5, but wherein the mirror is a plane mirror.

FIG. 6 schematically illustrates a sixth preferred embodiment 10E of a unit magnification optical projection system in accordance with the present invention. This embodiment is a mirror-plus-six-element embodiment similar to the embodiment of FIG. 5 but with a different configuration of elements in the positive (4-element) and negative (2-element) groups (G1, and G2, respectively), and wherein mirror M is a plane mirror rather than a concave mirror.

In the embodiment of FIG. 6, element L1 is a negative meniscus element; L2 and L3 are bi-convex elements; and L4 is a positive meniscus element. Elements L5 and L6 of group G2 are both negative meniscus elements as in the embodiment of FIG. 5. Mirror M is a flat (plane) mirror as noted above. An exemplary prescription for system 10E is presented in table form in FIG. 6A. This example has a 220 mm field diameter, and a NA=0.10, with diffraction-limited image quality performance at the narrow (±5 nm) band centered at 980 nm.

Figure 7:
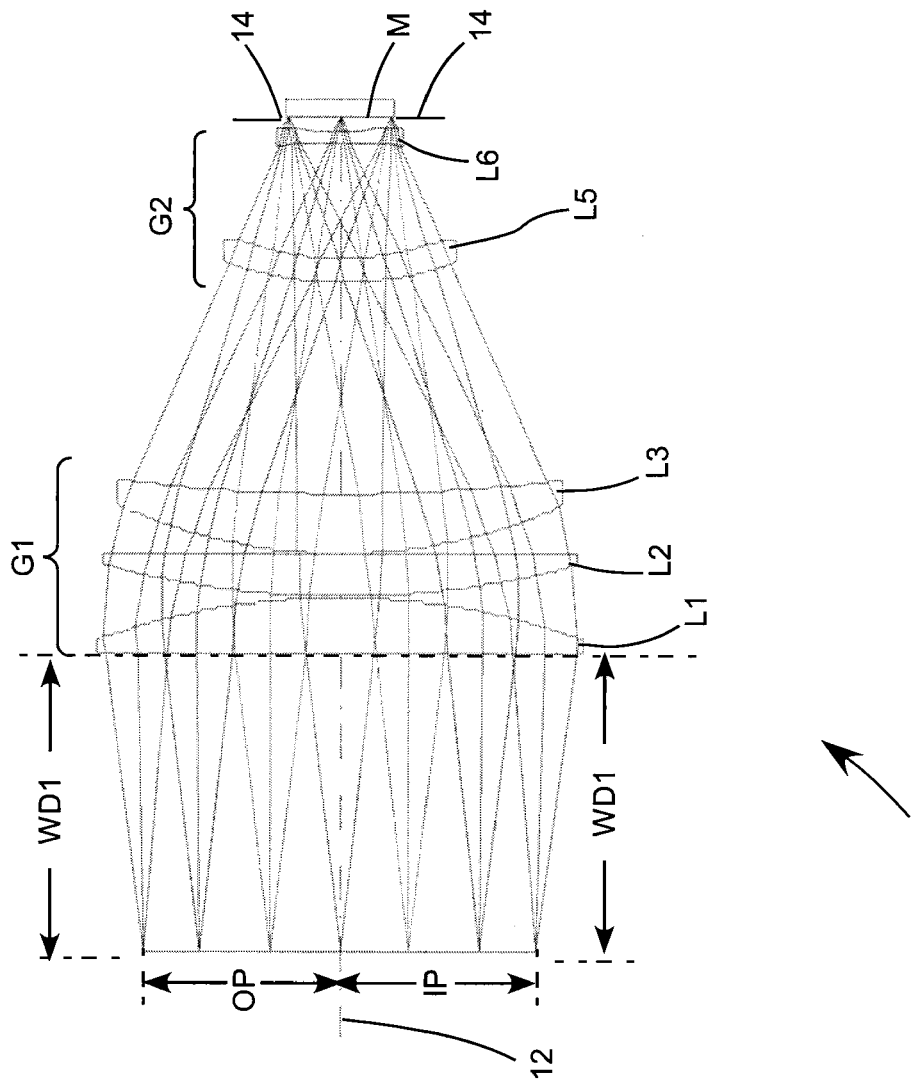
FIG. 7 is an unshaded cross-section view schematically illustrating a seventh preferred embodiment of a unit-magnification projection optical system in accordance with the present invention, similar to the embodiment of FIG. 1, but wherein the positive lens group includes only three elements and the negative lens group includes only two elements.

FIG. 7 schematically illustrates a seventh preferred embodiment 10F of a unit magnification optical projection system in accordance with the present invention. This embodiment is a mirror-plus-five-element embodiment similar to the embodiment of FIG. 5 but wherein positive group G1 includes only three elements L1, L2, and L3. Here mirror M is a concave mirror. In the embodiment of FIG. 7, element L1 is a plano-convex element; element L2 is a plano convex element; and L3 is a positive meniscus element. Element L5 of group G2 is a negative meniscus element and element L6 is a bi-concave element. An exemplary prescription for system 10F is presented in table form in FIG. 7A. This example has a 280 mm field diameter, and a NA=0.10, with diffraction-limited image quality performance at the narrow band centered at 980 nm.

Those skilled in the art will recognize that the embodiments presented above are described in order of a decreasing number of refractive optical elements combined with a mirror, plane or concave. For that reason, the first element of the second (negative power) group (G2) is consistently designated L5 even when there are less than four elements in positive group G1. This element designation system is retained throughout this specification.

Figure 8:
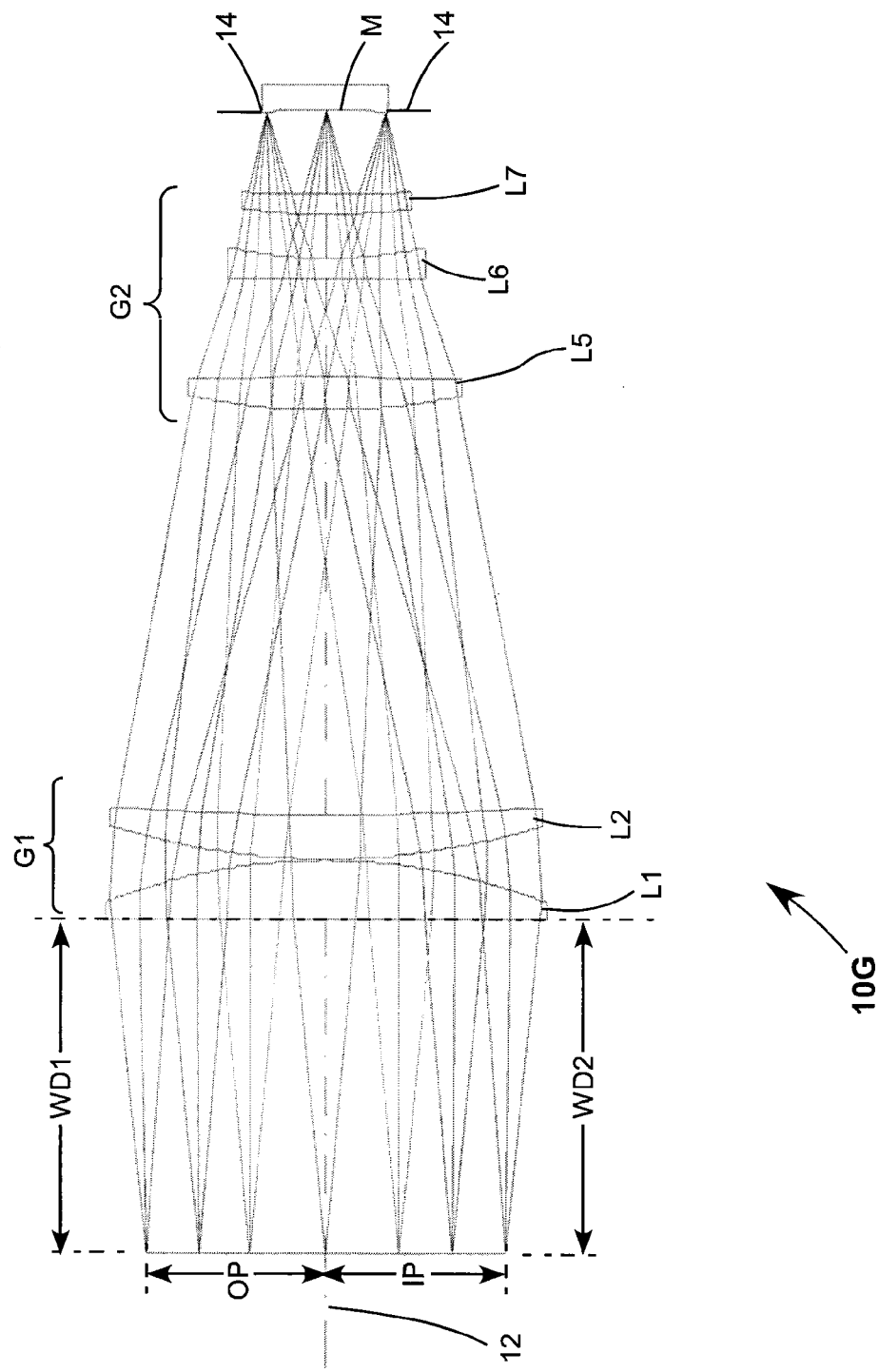
FIG. 8 is an unshaded cross-section view schematically illustrating an eighth preferred embodiment of a unit-magnification projection optical system in accordance with the present invention, similar to the embodiment of FIG. 1, but wherein the positive lens group has only two optical elements.

FIG. 8 schematically illustrates an eighth preferred embodiment 10G of a unit magnification optical projection system in accordance with the present invention. This embodiment is also a mirror-plus-five-element embodiment similar to the embodiment of FIG. 7 but wherein positive group G1 includes only two elements (L1 and L2), and negative group G2 includes three elements L5, L6, and L7. Mirror M is a concave mirror. In the embodiment of FIG. 8, element L1 is a plano-convex and element L2 is positive meniscus element. Element L5 of group G2 is a bi-convex element, element L6 is a bi-concave element, and element L7 is a positive meniscus element. An exemplary prescription for system 10G is presented in table form in FIG. 8A. This example has a 240 mm field diameter, a NA=0.10, with diffraction-limited image quality performance in a relatively broad spectral band centered at 420 nm and covering the spectrum encompassing g-h wavelengths (405 nm to 436 nm) of mercury. A practical application of above-described unit-magnification projection optical systems in lithography is to image one half of the full image plane surface onto the other half. For such field-division, the embodiments of FIG. 7 and FIG. 8 should enable exposure of a square or rectangular field of any size that can be inscribed in the area bounded semi-circular field with radius of 120 mm, for the NA≦0.10 configuration. These unit-magnification projection optical systems can be utilized in either in a step-and-repeat mode of exposure, or a step-and-scan mode of exposure.

Figure 9:
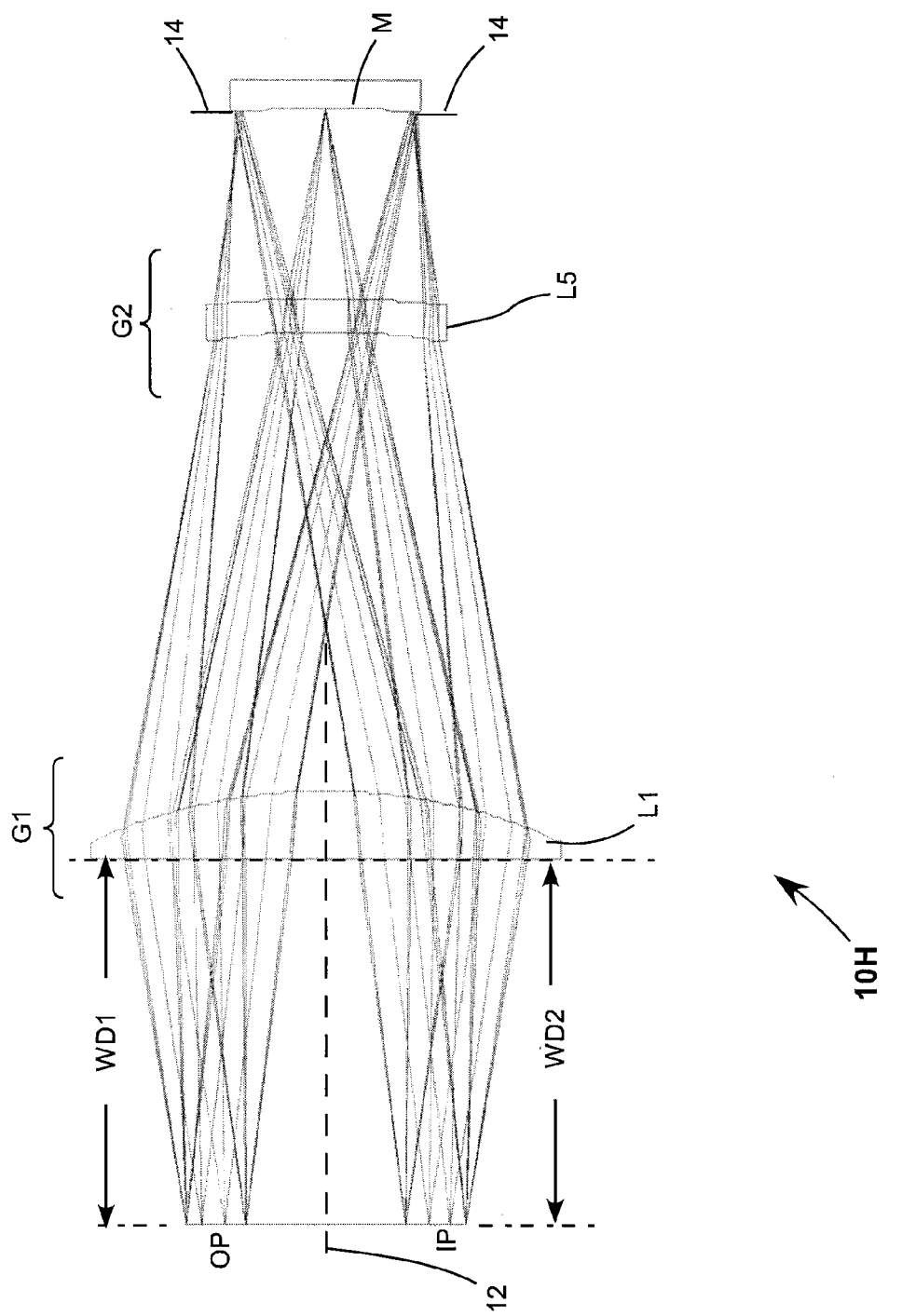
FIG. 9 is an unshaded cross-section view schematically illustrating an ninth preferred embodiment of a unit-magnification projection optical system in accordance with the present invention, similar to the embodiment of FIG. 1, but wherein the positive lens group and the negative lens group each have only one optical element.

FIG. 9 schematically illustrates a ninth preferred embodiment 10H of a unit magnification optical projection system in accordance with the present invention. In this embodiment, which in general terms still has the same functional layout as above described embodiments, positive group G1 and negative group G2 each include only a single lens element. In group G1, element L1 is a plano-convex element, preferably with the convex surface being aspheric. In Group G2, element L5 is a negative meniscus element. Mirror M is concave. An example of embodiment 10H has a field size of 130 mm×40 mm, and NA=0.10 with diffraction-limited image quality performance at the narrow band centered at 980 nm. Exemplary optical prescriptions for achieving this performance are presented in table form in FIG. 9A and FIG. 9B. Note that in both examples, the convex surface of element L1 (surface 2 in the tables) is aspheric, as specified.

Figure 10:
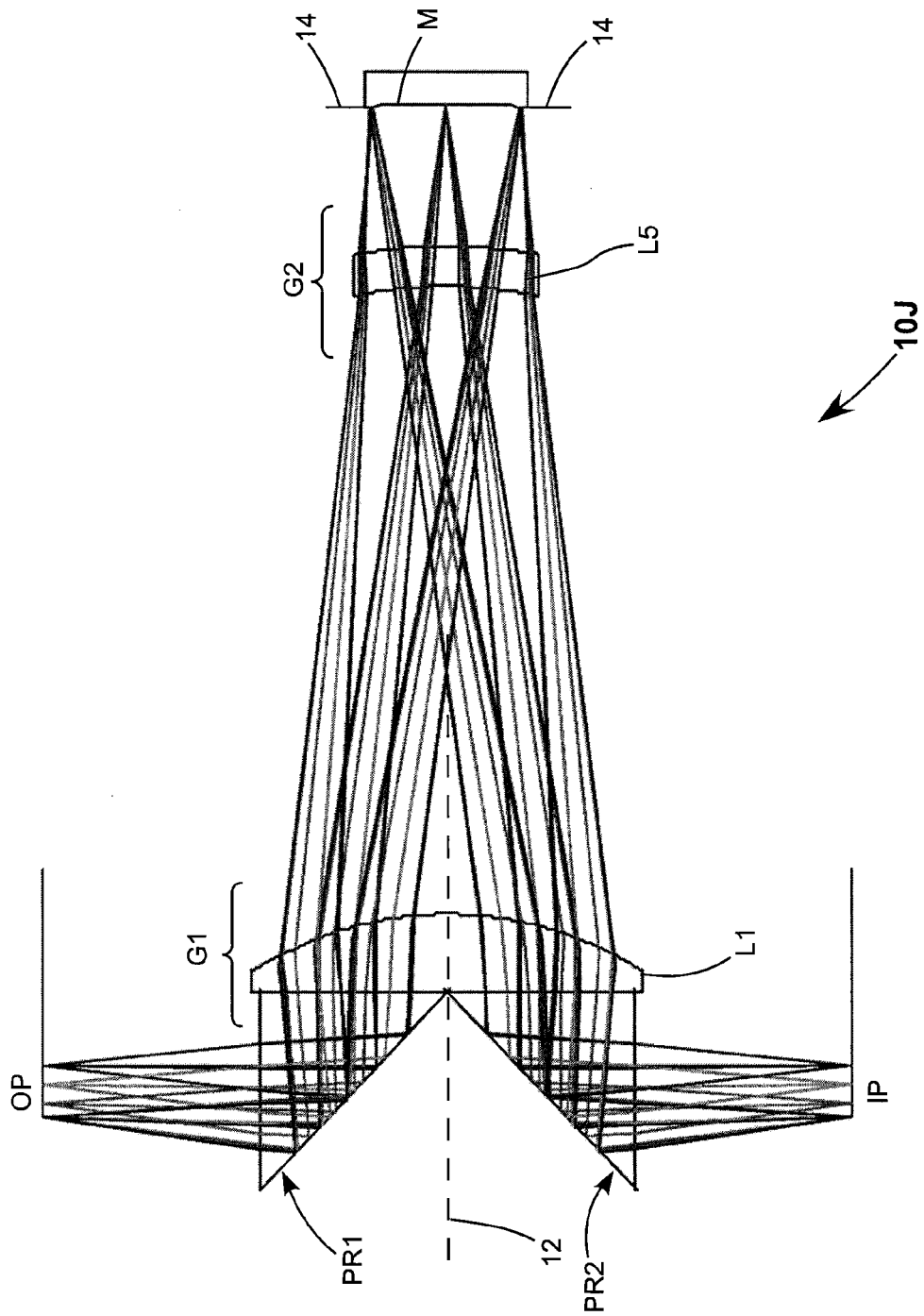
FIG. 10 is an unshaded cross-section view schematically illustrating a tenth preferred embodiment of a unit-magnification projection optical system in accordance with the present invention, similar to the embodiment of FIG. 9, but further including two identical fold prisms ahead of the positive lens group arranged to separate the object and image planes.

FIG. 10 schematically illustrates a tenth preferred embodiment 10J of a unit magnification optical projection system in accordance with the present invention. This embodiment is similar to the embodiment of FIG. 9 but includes two identical fold prisms PR1 and PR2 used to separate and to transfer the object plane OP and image plane IP to conveniently accessible positions. Exemplary optical prescriptions for embodiment 10J are presented in table form in FIG. 10A and FIG. 10B. These prescriptions for groups G1, G2 and mirror M are the same as in FIG. 9A and FIG. 9B respectively. The examples have a field size of 130 mm×40 mm, and NA=0.10, with diffraction-limited image quality performance at the narrow band centered at 980 nm. The example covers a field diameter of 260 mm enabling rectangular field sizes that can be inscribed within the semi-circular area bounded by the radius of 130 mm and the diameter of 230 mm. Narrow rectangular image fields or exposure fields required for masked laser patterning applications, for example, 202 mm×1 mm, easily fit within this semicircular field area.

Figure 11:
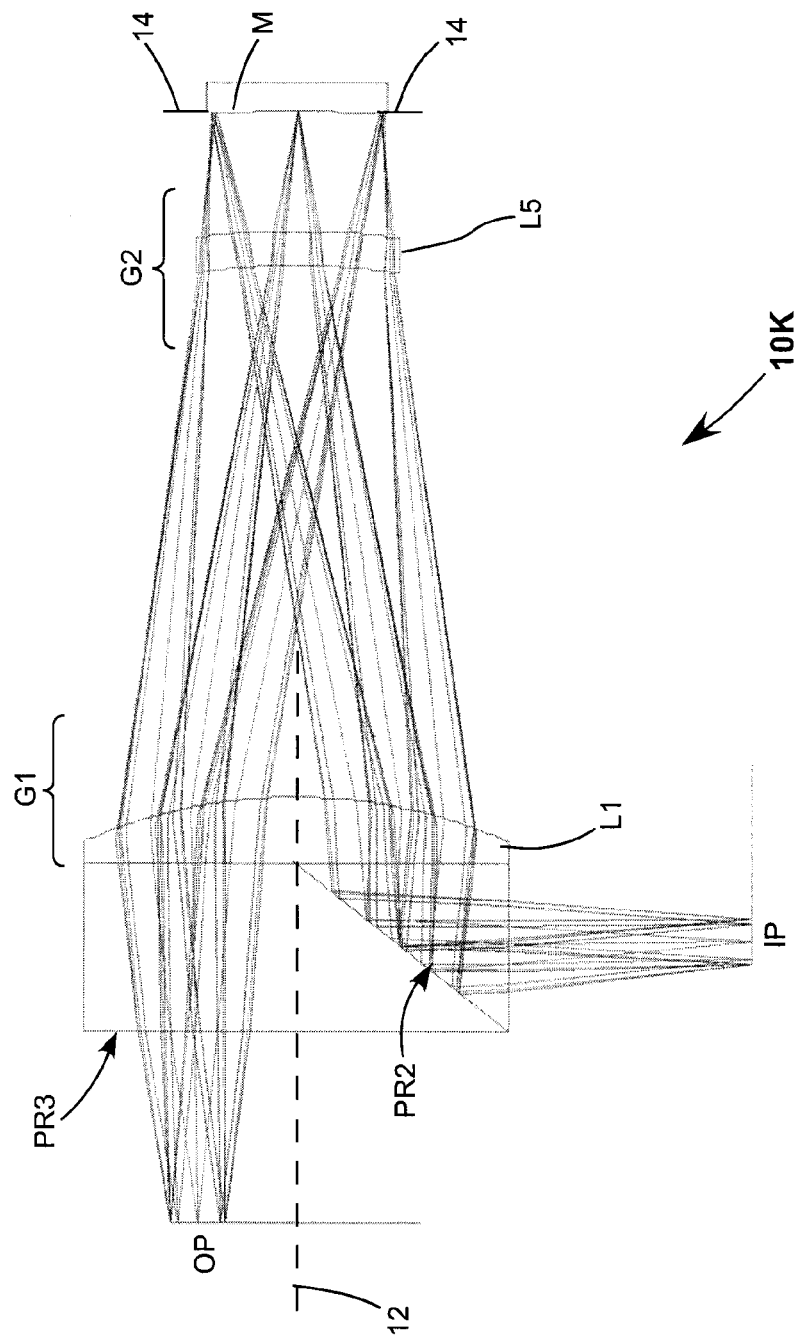
FIG. 11 is an unshaded cross-section view schematically illustrating an eleventh preferred embodiment of a unit-magnification projection optical system in accordance with the present invention, similar to the embodiment of FIG. 10, but wherein the object and image planes are separated by non-identical fold prisms ahead of the positive lens group.

FIG. 11 schematically illustrates an eleventh preferred embodiment 10K of a unit magnification optical projection system in accordance with the present invention. This embodiment is similar to the embodiment of FIG. 10 with an exception that identical prisms P1 and P2 are replaced in embodiment 10K by a prism assembly of prisms P2 and P3, which are not identical. The two examples of optical prescriptions provided in FIGS. 10A and 10B for the embodiment of FIG. 10 are applicable here. The prism geometry in embodiment 10K is configured differently from that of the pair of identical prisms of embodiment 10J, but glass optical path lengths in the prisms are identical.

Figure 12:
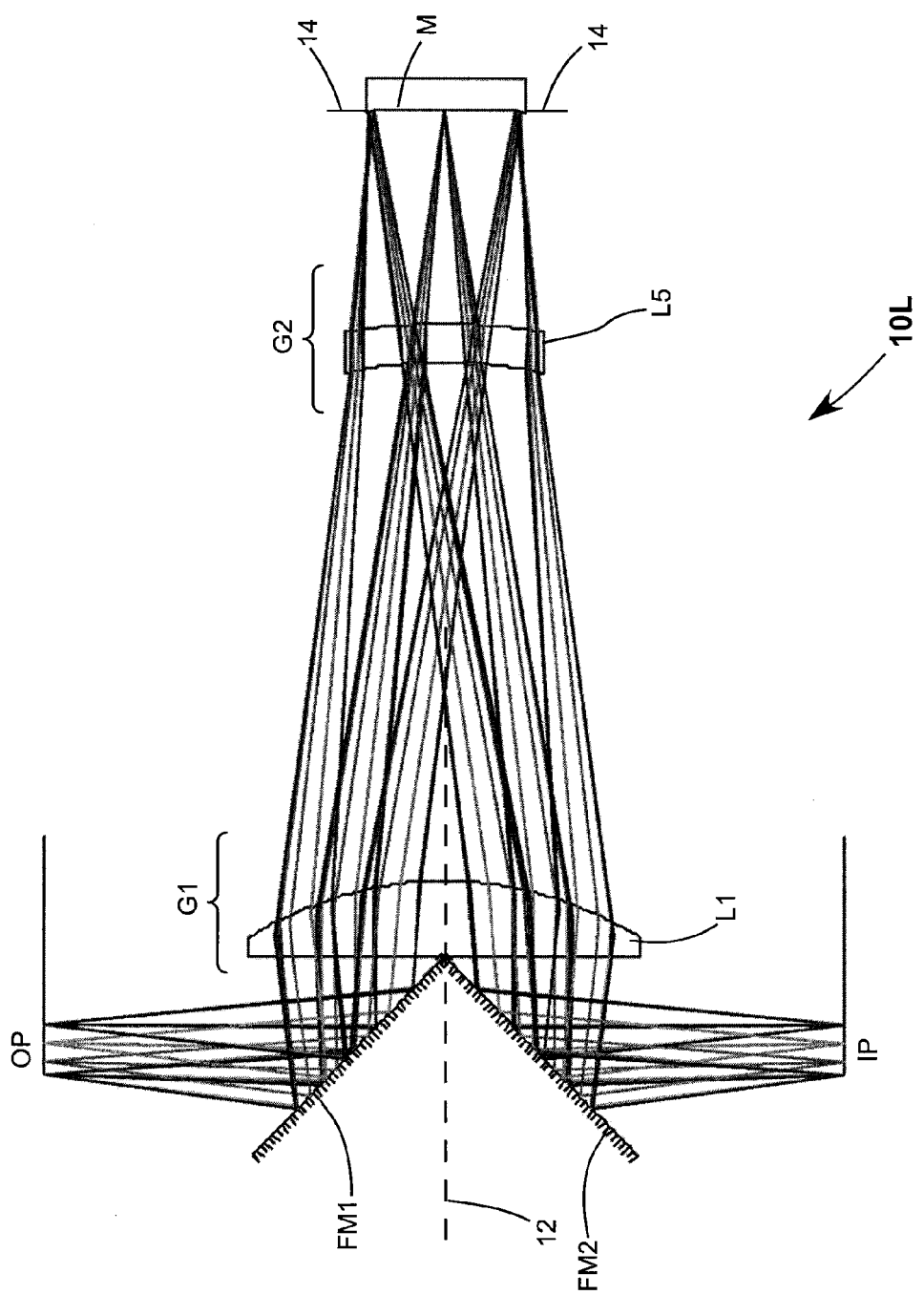
FIG. 12 is an unshaded cross-section view schematically illustrating a twelfth preferred embodiment of a unit-magnification projection optical system in accordance with the present invention, similar to the embodiment of FIG. 10, but wherein the object and image planes are separated by identical, plane, fold mirrors ahead of the positive lens group.

FIG. 12 schematically illustrates twelfth preferred embodiment 10L of a unit magnification optical projection system in accordance with the present invention. This embodiment is similar to the embodiment of FIG. 10 with an exception that identical prisms P1 and P2 are replaced in embodiment 10L by a pair of identical fold mirrors FM1 and FM2 used to separate and to transfer the object plane OP and image plane IP to convenient accessible positions. An example of embodiment 10L has a field size of 130 mm×40 mm, and NA=0.10, with diffraction-limited image quality performance at the narrow band centered at 980 nm. The example covers a field diameter of 260 mm, enabling rectangular field sizes that can be inscribed within the semi-circular area bounded by a radius of 130 mm and a diameter of 230 mm. The 130 mm×40 mm rectangular field is just one particular field size example. Other rectangular image fields or exposure fields required for masked-laser patterning applications, for example having dimensions 202 mm×1 mm, easily fit within this semicircular field area. The exemplary optical prescriptions of FIGS. 10A and 10B are applicable in this case.

Figure 13:
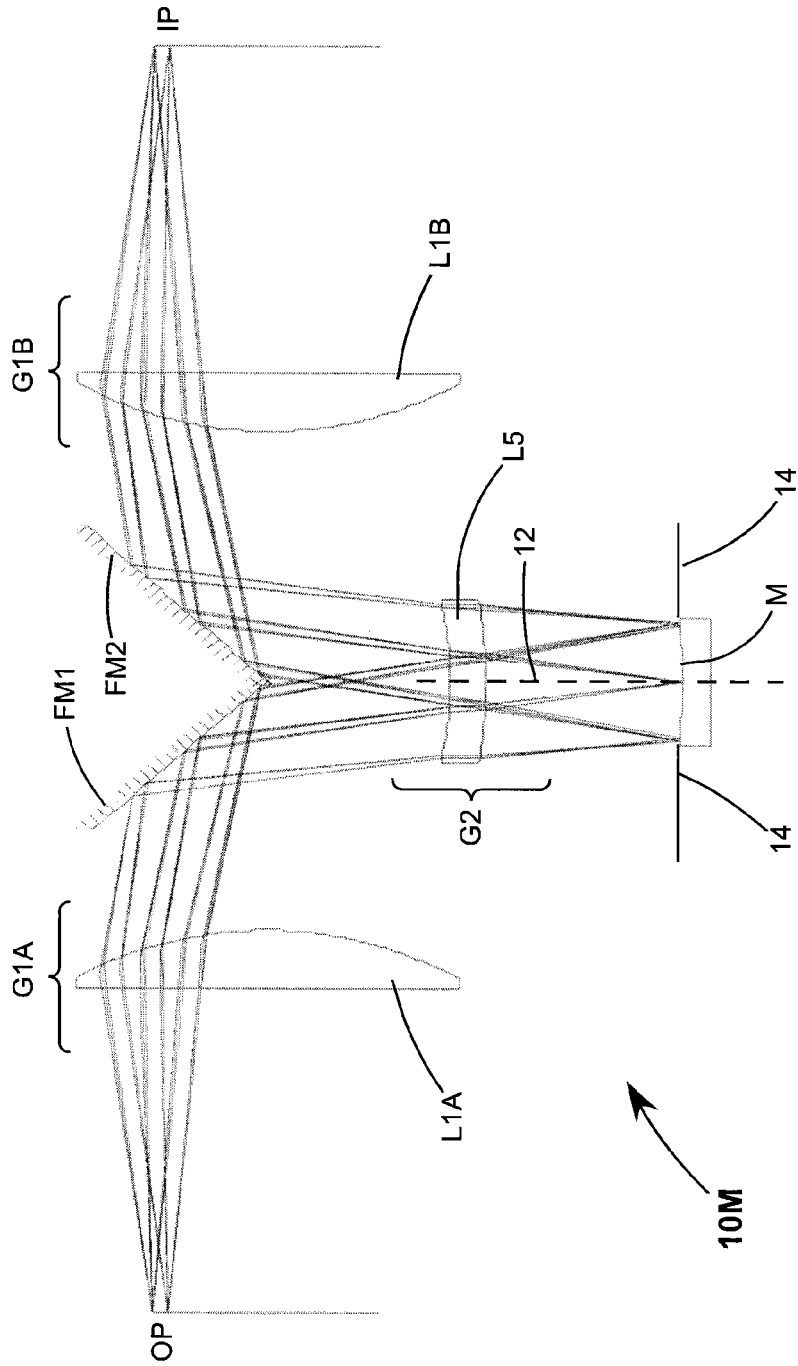
FIG. 13 is an unshaded cross-section view schematically illustrating a thirteenth preferred embodiment of a unit-magnification projection optical system in accordance with the present invention, similar to the embodiment of FIG. 12 but wherein the identical fold mirrors are located immediately ahead of the negative lens group and wherein there is a first and second positive lens groups in respectively object and image portions of the optical system.

FIG. 13 schematically illustrates a thirteenth preferred embodiment 10M of a unit magnification optical projection system in accordance with the present invention. This embodiment is somewhat similar in principle to the embodiment of FIG. 12 inasmuch as fold mirrors FM1 and FM2 are used to separate the object and image planes OP and IP. Here however the fold mirrors are located immediately preceding negative group G2 (single element L5). This means that a single positive group G1 can not be used for forward and reverse propagating rays. In order to compensate for this, separate, but here identical, positive groups G1A (on the object side) and G1B (on the image side) are provided, including identical lenses L1A and L1B respectively. In an exemplary prescription for this embodiment the configuration of positive elements and corresponding negative elements in the examples of FIGS. 10A and 10B may be used.

The large-field unit-magnification projection optical system of the present invention provides major improvement over the prior art systems referenced above. Unlike the above referenced Dyson and the Wynne-Dyson systems, all of the spherical surfaces need not be nearly concentric, and the centers of curvature of the spherical surfaces need not be located close to the focal plane of the unfolded system. This will be evident to one skilled in the optical design art from examination of any of the various exemplary prescriptions for various embodiments provided herein.

Without a restriction on concentricity of spherical surfaces and locations of the surfaces centers of curvatures, the unit-magnification projection optical system of the present invention extends its utility not only for low NA systems, but also for large field and large working distance imaging applications. Embodiments of the present invention are completely symmetric relative to the aperture stop. In an axially symmetric lens system, this consists in placing lens combinations symmetrically with reference to the center of the limiting aperture stop such that the lens elements on each side of the aperture stop is exactly similar, made to the same scale and material, with object and image are also of equal size, and the lenses position at equal distances from the aperture stop plane. Such holosymmetric imaging system operates at unit magnification and initially corrected for monochromatic third-order coma, distortion, and lateral color aberrations. The compact large-field unit-magnification imaging catadioptric projection optical system of the present invention evolved as a result of applying not only the holosymmetry principle but also by the using a reflective aperture stop or an aperture stop located at or nearly at the mirror element enabling the optical system to be folded into a system half as long and with a lesser number of lens elements than an unfolded dioptric system.

The mirror element in this catadioptric system of the present invention can be designed as either a flat or a curved mirror. In the preferred embodiments of the present invention, a concave mirror with shallow or benign curvature relative to its aperture size is preferable since this mirror in conjunction with the lens elements in the system helps to correct the remaining optical aberrations which include astigmatism, Petval, spherical aberration, and axial color. For broad spectral band applications, as in as in the example of the embodiment of FIG. 8, the chromatic aberrations and chromatic variations of the monochromatic aberrations are reduced also by choosing the dioptric power distributions of the optical elements, the lens elements shape factors or geometrical shapes and the proper choice of the glass materials for system achromatization. The system is also telecentric in the object and image spaces when the aperture stop is located coincident at or nearly at the focal plane of the lens subsystem before the aperture stop and the lens subsystem after the aperture stop. The inventive unit magnification catadioptric projection optical system has object and image fields that are mutually inverted and lie co-planar in the embodiments not including fold mirrors or prisms for separating the fields. The inventive system can also be used to image one half of the full image plane surface onto the other half.

In conclusion, the present invention is described above with reference to a number of preferred embodiments. The invention, however, is not limited to the embodiments described and depicted herein. Rather, the invention is defined by the claims appended hereto.

What is claimed is:

1. A unit-magnification optical system having a longitudinal system axis, comprising:
    a minor located on the system axis;
    an aperture stop located at the minor and defining a numerical aperture (NA) of the system;
    a first lens group including at least one optical element and having negative optical power located on the system axis and spaced apart from the mirror;
    a second lens group including at least one lens element and having positive optical power located on the system axis and spaced apart from the first lens group;
    an object plane located spaced apart by a first working distance from the second lens group;
    an image plane spaced apart from the second lens group by a second working distance; and
    wherein the object plane and image plane lie on opposite sides of the system axis and wherein the first and second working distances are the same and the object and image planes are coplanar in a plane perpendicular to the system axis.

2. The optical system of claim 1, wherein each of the first and second lens groups includes only one lens element.

3. The optical system of claim 2, wherein the lens element of the first lens group is a negative meniscus element.

4. The optical system of claim 3, wherein the lens element of the second lens group is a plano-convex element.

5. The optical system claim 1, wherein each of the first and second lens groups includes a plurality of optical elements each thereof including at least one curved surface.

6. The optical system of claim 5 wherein the first lens group includes a negative meniscus element.

7. The optical system of claim 5 wherein the first lens group consists of three lens elements and the second lens group consists of four lens elements.

8. The optical system of claim 5 wherein the first lens group consists of four lens elements and the second lens group consists of three lens elements.

9. The optical system of claim 5 wherein the first lens group consists of two lens elements and the second lens group consists of four lens elements.

10. The optical system of claim 5 wherein the first lens group consists of two optical elements and the second lens group consists of three optical elements.

11. The optical system of claim 5 wherein the first lens group consists of three optical elements and the second lens group consists of two optical elements.

12. The optical system of claim 5, wherein the minor has a curved reflecting surface and the centers of curvature of the minor surface and the curved surfaces of the lens are not concentric.

13. A unit-magnification optical system having a longitudinal system axis, comprising:
 a minor located on the system axis;
 an aperture stop located at the minor and defining a numerical aperture (NA) of the system;
 a first lens group including at least one optical element and having negative optical power located on the system axis and spaced apart from the mirror;
 a second lens group including at least one lens element and having positive optical power located on the system axis and spaced apart from the first lens group;
 an object plane located spaced apart by a first working distance from the second lens group;
 an image plane spaced apart from the second lens group by a second working distance; and
 wherein the object plane and image plane lie on opposite sides of the system axis and further including at least one plane reflecting surface immediately adjacent the second lens group, inclined to the optical axis, and arranged to spatially separate the object and image planes.

14. The optical system of claim 13 wherein there are first and second reflecting surfaces each inclined at 45 degrees to the system axis on opposite sides thereof and arranged such that the image and object planes are parallel to the axis on opposite sides thereof.

15. The optical system of claim 14, wherein the first and second reflecting surfaces are surfaces of respectively first and second minors.

16. The optical system of claim 14, wherein the reflecting surfaces are internal reflecting surfaces of respectively first and second prisms.

17. A unit-magnification optical system having a longitudinal system axis, comprising:
 a mirror located on the system axis, the mirror having a concave curved reflecting surface;
 an aperture stop located at the minor and defining a numerical aperture (NA) of the system;
 a negative meniscus lens element located on the system axis spaced apart from the minor, the negative meniscus lens having two curved surfaces:
 a plano-convex lens element located on the system axis spaced apart from the negative meniscus lens element, the plano-convex lens element having one curved surface;
 an object plane spaced apart by a first working distance from the plano-convex lens element;
 an image plane spaced apart from the plano-convex lens element by a second working distance; and
 wherein the object plane and image plane lie on opposite sides of the system axis and centers of curvature of the curved surfaces of the minor, the negative meniscus lens and the plano-convex lens are not concentric and wherein the first and second working distances are the same and the object and image planes are coplanar in a plane perpendicular to the system axis.

18. The optical system of claim 17 wherein the curved surface of the plano-convex lens is an aspheric surface.

* * * * *